(12) United States Patent
Kim

(10) Patent No.: US 6,472,284 B2
(45) Date of Patent: Oct. 29, 2002

(54) METHOD FOR FABRICATING A MOSFET HAVING A THICK AND THIN PAD OXIDE AT THE GATE SIDES

(75) Inventor: Nam-Sung Kim, Choongcheongbuk-Do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 09/934,556

(22) Filed: Aug. 23, 2001

(65) Prior Publication Data

US 2002/0025641 A1 Feb. 28, 2002

(30) Foreign Application Priority Data

Aug. 31, 2000 (KR) .............................................. 00-51217

(51) Int. Cl.[7] .............................................. H01L 21/336
(52) U.S. Cl. ....................... 438/305; 438/307; 438/595; 438/981
(58) Field of Search ................................ 438/305, 306, 438/307, 529, 595, 981

(56) References Cited

U.S. PATENT DOCUMENTS

| 4,855,247 | A | * | 8/1989 | Ma et al. ..................... 438/307 |
| 5,434,093 | A | * | 7/1995 | Chau et al. .................. 438/305 |
| 5,538,913 | A | * | 7/1996 | Hong .......................... 438/307 |
| 5,750,430 | A | * | 5/1998 | Son ............................. 438/307 |
| 5,773,348 | A | * | 6/1998 | Wu ............................. 438/305 |

* cited by examiner

*Primary Examiner*—Chandra Chaudhari
(74) *Attorney, Agent, or Firm*—Birch, Stewart, Kolasch & Birch, LLP

(57) ABSTRACT

A MOS transistor and a method for fabricating the MOS transistor which includes the forming a gate electrode containing an HLD film; etching the HLD film; etching a pad oxide film formed at a lower portion of the HLD film at a predetermined thickness; removing the nitride side wall spacer of an opening in the gate electrode; forming a LDD region by implanting impurity ions into the semiconductor substrate at both sides of the gate electrode; forming a side wall spacer at both sides of the gate electrode; and forming a source/drain by implanting impurity ions into the semiconductor substrate.

9 Claims, 5 Drawing Sheets

METHOD FOR FABRICATING A MOSFET HAVING A THICK AND THIN PAD OXIDE AT THE GATE SIDES

BACKGROUND OF THE INVENTION

1. Field of the Invention

The invention pertains to a semiconductor device and a method for fabricating a semiconductor device, particularly a method for fabricating a MOS transistor.

2. Description of the Background Art

Thinning of a gate insulating film and increasing impurity concentration causes an increase in internal electric fields unless the source voltage is scaled, High electric fields consequently cause a variety of physical problems. A high electric field around a drain causes an electron-hole pair (due to collisional ionization), hot carrier implantation into a gate insulating film, tunneling between bands, etc. Accordingly, the reliability of a MOS transistor is compromised.

Thus, one of the main problems in designing the structure of an MOS transistor involves developing a drain structure for alleviating a high electric field around a drain. To solve this problem, a semiconductor device having a LDD (lightly doped drain) structure is developed.

A method for fabricating a semiconductor device having a LDD structure according to the conventional art is described below with reference to the accompanying drawings.

FIG. 1A illustrates a gate oxide film 101 and a gate electrode 102 being consecutively formed on the upper surface of a semiconductor substrate 100.

Next, as illustrated in FIG. 1B, a buffer oxide film 103 is formed on the front surface of the structure of FIG. 1A, and thereafter phosphor (P) ions are implanted into the semiconductor substrate 100, thereby forming a lightly doped impurity region, e.g., a lightly doped drain (LDD) region 104 in the semiconductor substrate 100 at both sides of the gate electrode 102. Here, the lightly doped region 104 refers to a region whose impurity concentration is relatively lower than that of a source/drain to be fabricated in a subsequent process. That is, lightly doped region 104 is a lightly doped ion implantation region. The source/drain region is hereafter referred to as a heavily doped ion implantation region.

Next, as illustrated in FIG. 1C, an oxide film or nitride film is formed on the upper surface of the structure in FIG. 1B by high temperature low pressure chemical vapor deposition. Afterwards, anisotropic etching is carried out on the nitride film without using an etching mask, thereby forming a side wall spacer 105 at both side walls of the gate electrode 102. The anisotropic etching can be carried out at a uniform thickness.

Next, as illustrated in FIG. 1D, a heavily doped region 106, e.g., a source/drain, is formed in the semiconductor substrate 100 at the outer side of the side wall spacer 105 by implanting arsenic (As) ions into the semiconductor substrate 100, thus completing the fabrication of a n-type MOS transistor. The heavily doped region 106 denotes a region having a relatively higher impurity concentration than that of the lightly doped region 104.

However, the semiconductor device fabricated by the conventional method has the following problems.

When ion implantation is used for forming a LDD region, the ion implantation is carried out when the buffer oxide film covers the gate electrode causing the overlap length of the gate electrode and LDD region to decrease as much as the thickness of the buffer oxide film. This causes an increase of horizontal electric fields of a channel, and a hot carrier is implanted into the gate insulating film, thereby causing degradation of the device characteristics and serious reliability problems. In addition, there is a problem that the refresh time characteristic deteriorates due to the high electric field.

SUMMARY OF THE INVENTION

Accordingly, the invention, in part, provides a method for fabricating a MOS transistor which improves the refresh time characteristic and alleviates the hot carrier effect problem by increasing the overlap length of a LDD region and gate electrode and reducing a horizontal electric field of a channel. Accordingly, the side walls at both sides of the gate electrode do not completely cover a buffer oxide film.

The invention, in part, provides a semiconductor device (MOS transistor) having an improved refresh time characteristic by reducing the junction concentration of a LDD region and increasing the overlap length of the LDD region and a gate electrode. The horizontal electric field of a channel is thereby reduced, and hot carrier resistance intensifies by forming a thick pad oxide film at both sides of the gate electrode, thereby preventing hot carrier ion implantation into a gate insulating film.

In addition, the invention, in part, provides a method for fabricating a MOS transistor that reduces the impurity ion concentration of a LDD region by deeply forming a LDD junction in a semiconductor substrate using a cascade pad oxide film. Accordingly, the refresh time characteristic improves by increasing depletion width for thus alleviating an electric field around a channel.

To achieve the above, the MOS transistor fabrication method according to the invention includes the steps of: forming a pad oxide film on the upper surface of a semiconductor substrate; forming a HLD film on the upper surface of the pad oxide film; forming an opening which a gate electrode to be desired to be formed fits in by selectively etching the HLD oxide film; forming a nitride side wall spacer on side walls of the HLD film within the opening; etching and removing the pad oxide film within the opening; forming a gate oxide film at a portion from which the pad oxide film is removed; forming a gate electrode by filling the opening on the upper surface of the gate oxide film with a gate electrode material layer; etching the HLD film; etching the pad oxide film formed at a lower portion of the HLD film at a predetermined thickness; removing the nitride side wall spacer; forming a LDD region by implanting impurity ions into the semiconductor substrate at both sides of the gate electrode; forming a side wall spacer at both sides of the gate electrode; and forming a source/drain by implanting impurity ions into the semiconductor substrate using the side wall spacer as a mask.

To achieve the above, the MOS transistor fabrication method according to the invention further includes a step of forming a punch through stop layer in the semiconductor substrate within the opening by implanting impurity ions into the semiconductor substrate via the opening. This step is performed after the step of forming a nitride side wall spacer on the HLD side walls.

To achieve the above, the MOS transistor fabrication method according to the invention further includes the step of forming a threshold voltage control layer on an upper portion of the punch through stop layer in the semiconductor substrate in the opening.

To achieve the, the MOS transistor fabrication method according to the invention further provides the gate electrode being formed as a polysilicon, silicide, or polycide layer.

To achieve the above, the MOS transistor fabrication method according to the invention further provides that the step of etching the pad oxide film formed at a lower portion of the HLD film at a predetermined thickness is a step of etching the pad oxide film at about half the overall thickness thereof.

To achieve the above, the MOS transistor fabrication method according to the invention further includes the step of forming a halo ion implantation layer so as to cover the LDD region after the step of forming the LDD region.

It is to be understood that both the foregoing general description and the following detailed description are exemplary and explanatory and are intended to provide further explanation of the invention as claimed.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

A preferred embodiment of the present invention will now be described with reference to FIGS. 2A through 2M.

Figure 1A:
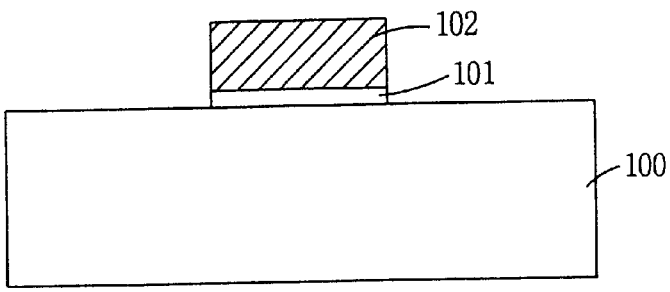
FIG. 1A is a cross-sectional view of a semiconductor substrate illustrating a method step for fabricating a MOS transistor according to the background art.
Figure 1B:
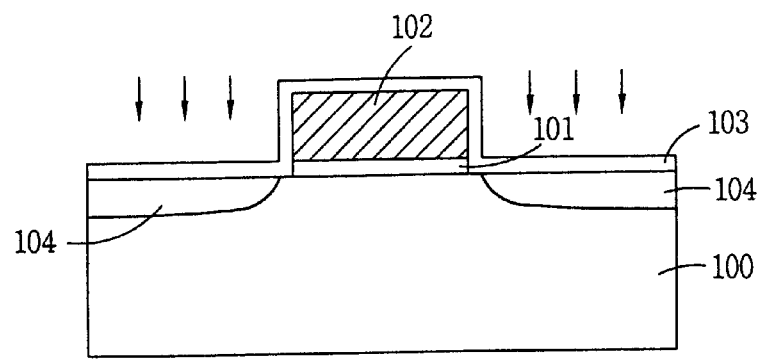
FIG. 1B is a cross-sectional view of a semiconductor substrate illustrating a method step for fabricating a MOS transistor according to the background art.
Figure 1C:
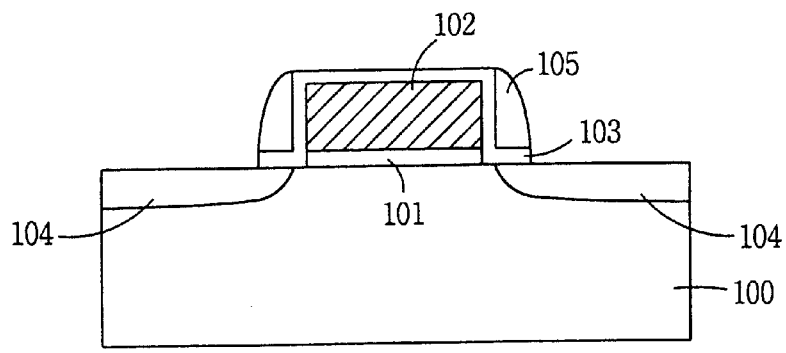
FIG. 1C is a cross-sectional view of a semiconductor substrate illustrating a method step for fabricating a MOS transistor according to the background art.
Figure 1D:
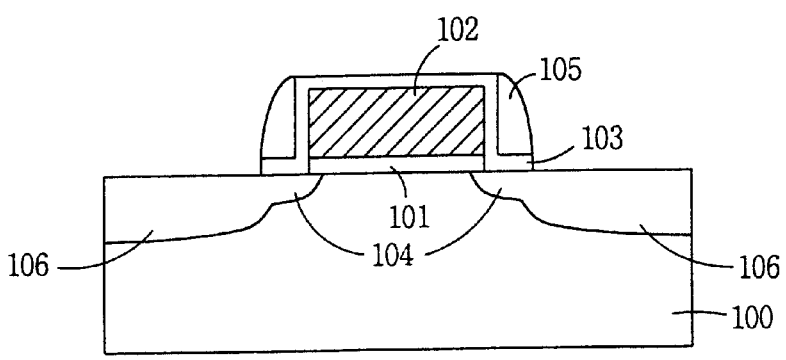
FIG. 1D is a cross-sectional view of a semiconductor substrate illustrating a method step for fabricating a MOS transistor according to the background art.
Figure 2A:
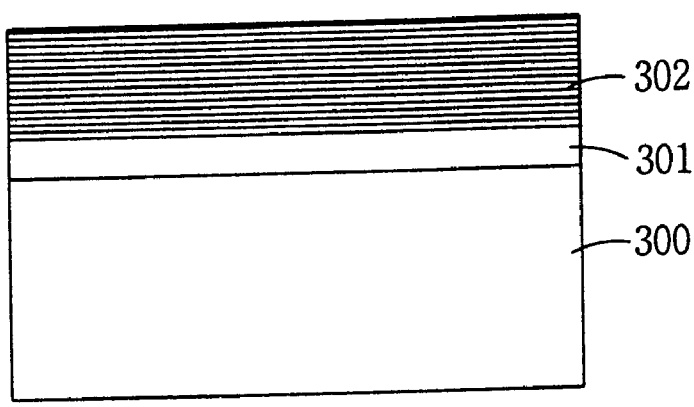
FIG. 2A is a cross-sectional view of a semiconductor substrate illustrating a method step for fabricating a MOS transistor according to the present invention.

First, as illustrated in FIG. 2A, a pad oxide film 301 is formed on the upper surface of a p-type semiconductor substrate 300. Afterwards, an oxide film 302 is formed over the upper surface of the pad oxide film 301 by high temperature low pressure chemical vapor deposition (CVD). The oxide film 302 formed by the high temperature low pressure deposition is hereafter referred to as a HLD film (high temperature low pressure deposition oxide layer).

Figure 2B:
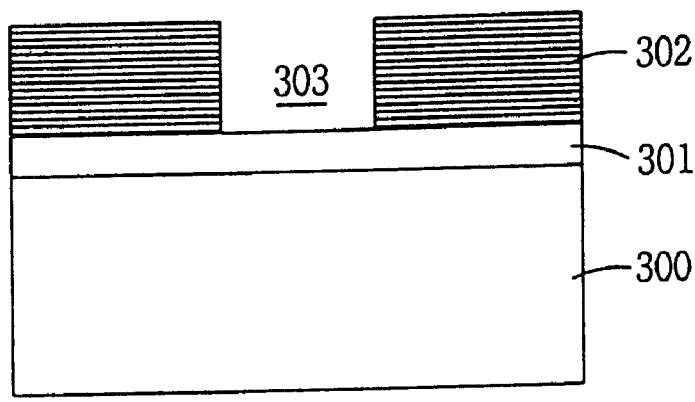
FIG. 2B is a cross-sectional view of a semiconductor substrate illustrating a method step for fabricating a MOS transistor according to the present invention.

Next, as illustrated in FIG. 2B, the HLD film 302 is partially etched and removed to form an opening 303 at a portion where a gate electrode is to be formed. As shown, a portion of the pad oxide film 301 is etched as well.

Figure 2C:
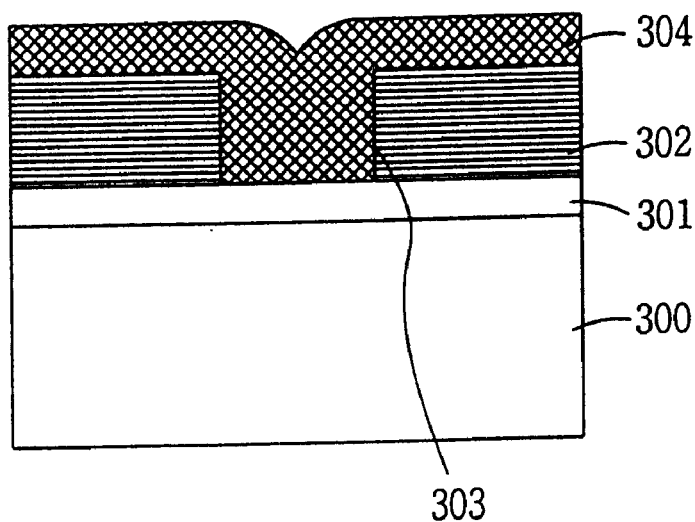
FIG. 2C is a cross-sectional view of a semiconductor substrate illustrating a method step for fabricating a MOS transistor according to the present invention.

Next, as illustrated in FIG. 2C, a nitride film 304 for forming side wall spacers in the opening 303 are deposited.

Figure 2D:
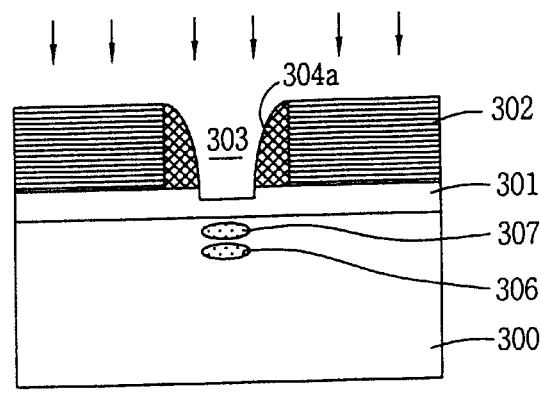
FIG. 2D is a cross-sectional view of a semiconductor substrate illustrating a method step for fabricating a MOS transistor according to the present invention.

Next, as illustrated in FIG. 2D, anisotropic etching without a mask is carried out on the nitride film 304 to thereby form nitride side wall spacers 304a on side walls of the HLD film 302.

Next, p-type impurity ions are implanted into the semiconductor substrate 300 via the opening 303 to form a punch through stop layer 306 having a p-type impurity ion concentration relatively higher than that in the semiconductor substrate. Next, n-type impurity ions are implanted into the semiconductor substrate 300 in order to form a threshold voltage control layer 307 for controlling the threshold voltage of a channel region at an upper portion of the punch through stop layer 306.

Figure 2E:
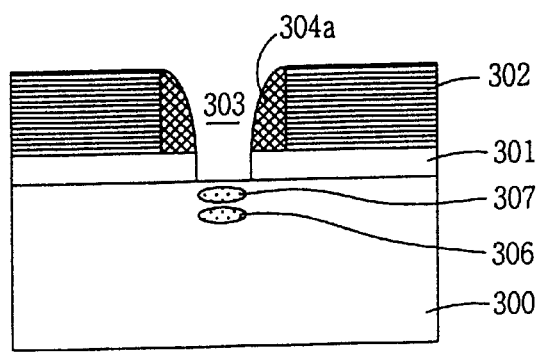
FIG. 2E is a cross-sectional view of a semiconductor substrate illustrating a method step for fabricating a MOS transistor according to the present invention.

Next, as illustrated in FIG. 2E, the remaining pad oxide film 301 in the opening 303 is etched and removed to thus expose the upper surface of the semiconductor substrate 300.

Figure 2F:
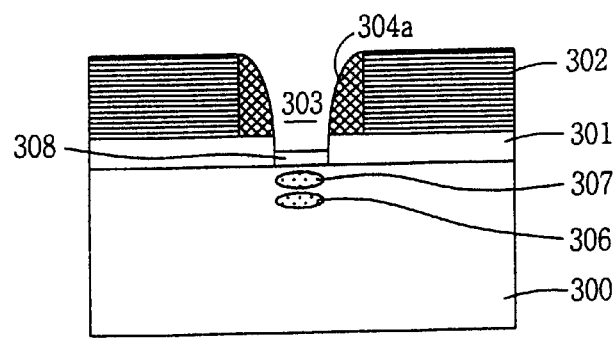
FIG. 2F is a cross-sectional view of a semiconductor substrate illustrating a method step for fabricating a MOS transistor according to the present invention.

Next, as illustrated in FIG. 2F, a gate oxide film 308 is formed on the upper surface of the semiconductor substrate 300 in the opening 303.

Figure 2G:
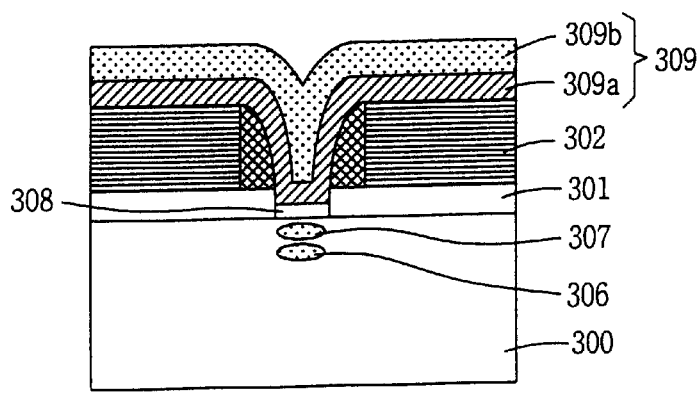
FIG. 2G is a cross-sectional view of a semiconductor substrate illustrating a method step for fabricating a MOS transistor according to the present invention.

Next, as illustrated in FIG. 2G, a gate electrode material layer 309 is formed on the upper surface of the structure of FIG. 2F. The gate electrode material layer can be formed as a single layer of polysilicon or silicide, or can be formed as a polycide layer of a structure in which silicide layers stacked on the upper surface of a polysilicon layer. In the embodiment of FIG. 2G, a polycide layer 309 having a polysilicon layer 309a and a silicide layer 309b, is employed as a gate electrode material layer.

Figure 2H:
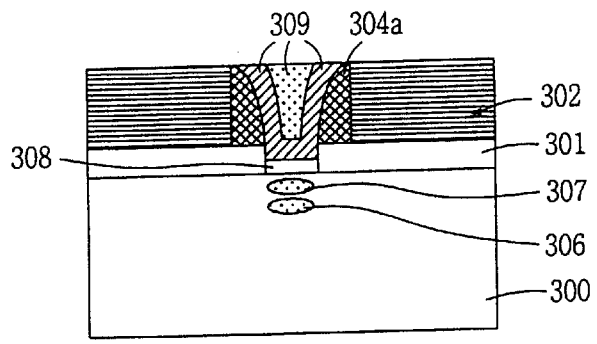
FIG. 2H is a cross-sectional view of a semiconductor substrate illustrating a method step for fabricating a MOS transistor according to the present invention.

Next, as illustrated in FIG. 2H, a chemical mechanical polishing process is carried out on the gate electrode material layer 309 so as to expose the upper surface of the HLD film 302. As a result, the gate electrode material layer remains only in the opening 303 to thus form a gate electrode 309.

Figure 2I:
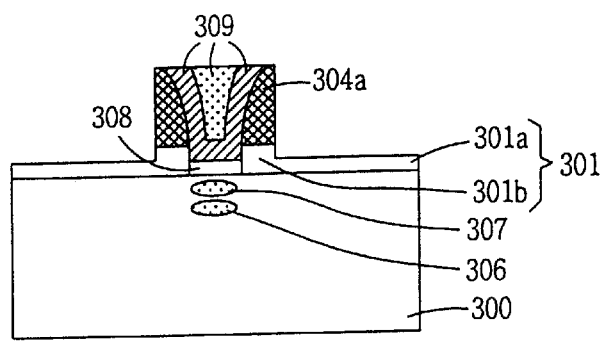
FIG. 2I is a cross-sectional view of a semiconductor substrate illustrating a method step for fabricating a MOS transistor according to the present invention.

Next, as illustrated in FIG. 2I, the HLD film 302 is etched and removed. Next, the pad oxide film 301 formed at both sides of the gate electrode 309 is slightly etched to thus form a thin pad oxide film 301a.

Figure 2J:
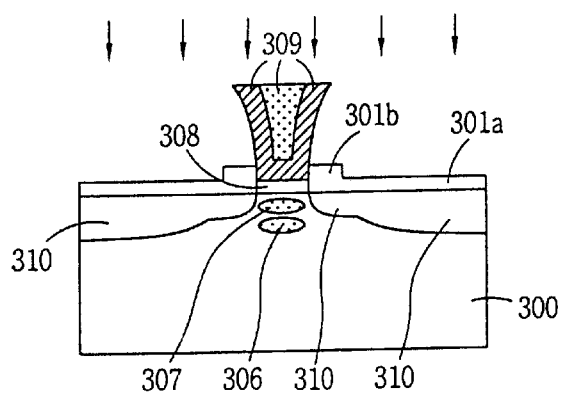
FIG. 2J is a cross-sectional view of a semiconductor substrate illustrating a method step for fabricating a MOS transistor according to the present invention.

Next, as illustrated in FIG. 2J, the side wall spacer 304a is selectively removed. At this time, the pad oxide film 301b formed at the lower portion of the side wall spacer 304a is relatively thicker than the thin pad oxide film 301a, and is hereinafter referred to as a thick oxide film 301b. As a result, the thick pad oxide film 301b is formed at a portion adjacent to both edges of the gate electrode 309, and the thin pad oxide film 301a is formed at a distance from the gate electrode 309. Thus the pad oxide film has a cascade structure. Then, n-type impurity ions are implanted into the semiconductor substrate 300 at a dose of about $1–5\times10^{13}$ atoms/cm$^2$ by using the pad oxide film 301a and 301b as a buffer layer, for thereby forming a first lightly doped ion implantation region 310. The first lightly doped ion implantation region 310 designates a region having an ion implantation concentration relatively lower than that of a heavily doped ion implantation region (source/drain region) to be formed later, and is hereafter referred to as a first LDD region 310. At this time, a first LDD region 310 having a shallow junction is formed in the semiconductor substrate 300 around the gate electrode at which the thick pad oxide film 301b is formed, and a first LDD region 310 having a relatively deep junction is formed in the semiconductor substrate 300 at a distance from the gate electrode 309 at which the thin pad oxide film 301a is formed. Thus, there is an effect of extending a depletion width around a drain junction, because a LDD junction is broadened as compared to the conventional art. In addition, there is another effect of reducing an electric field as the impurity ion concentration of the LDD region decreases due to the broadened LDD junction.

Figure 2K:
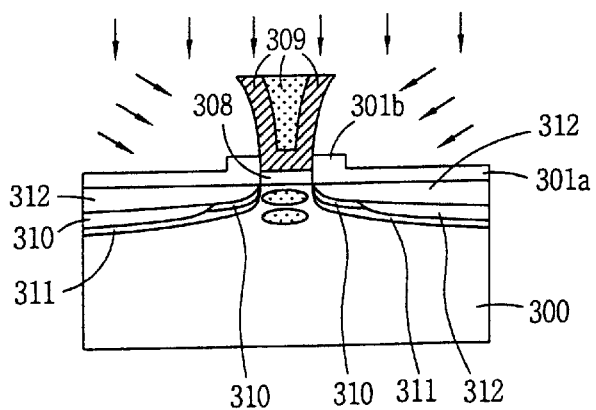
FIG. 2K is a cross-sectional view of a semiconductor substrate illustrating a method step for fabricating a MOS transistor according to the present invention.

Next, as illustrated in FIG. 2K, p-type impurity ions are implanted by an advancing slope ion implantation method in order to form a halo ion implantation layer 311 so as to cover the first LDD junction. Then, n-type impurity ions are implanted to form a second lightly doped region, that is, a LDD region 312, in the first LDD region 310.

Figure 2L:
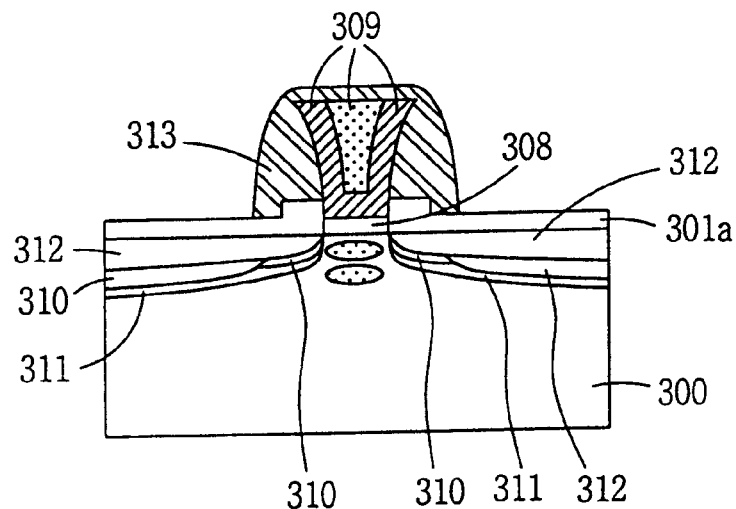
FIG. 2L is a cross-sectional view of a semiconductor substrate illustrating a method step for fabricating a MOS transistor according to the present invention.

Next, as illustrated in FIG. 2L, a side wall spacer 313 is formed on the side walls of the gate electrode 309.

Figure 2M:
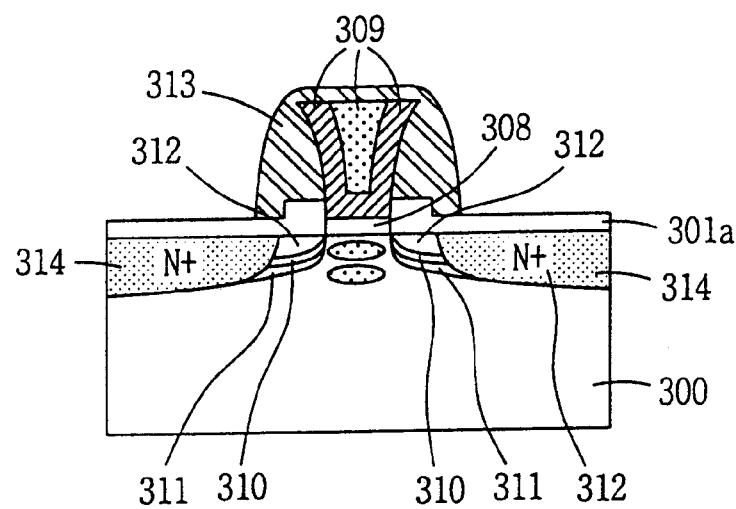
FIG. 2M is a cross-sectional view of a semiconductor substrate illustrating a method step for fabricating a MOS transistor according to the present invention.

Next, as illustrated in FIG. 2M, a heavily doped ion implantation region 314, that is, a source drain region 314, is formed by implanting n-type impurity ions into the semiconductor substrate 300 at a dose of about $1–5\times10^{15}$ atoms/cm$^2$ by using the side wall spacer 313 as a mask, thus completing the fabrication of the semiconductor device according to the present invention.

In the method for semiconductor device fabrication according to the invention, a subsequent counter doping with ions to form a source/drain junction is prevented by selectively forming a punch through stop layer and a channel threshold voltage control layer only on the semiconductor substrate at the lower portion of the gate electrode, thus enabling fine tuning of the transistor characteristics.

In addition, a LDD region, that has a deep junction formed by an increase in ion implantation energy during the formation of the LDD region, is formed by forming a thick pad oxide film on sides of the gate electrode. Thus the electric field is reduced by the extension of a LDD junction to accordingly improve the refresh characteristic.

In addition, a horizontal electric field of a channel is reduced by increasing the overlap length of the gate electrode and LDD region, thus intensifying a hot carrier effect and improving the refresh time characteristic.

In addition, a thick oxide film is formed at both sides of the gate electrode to thereby improving the hot carrier effect.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A method for fabricating a MOS transistor, comprising the steps of:

forming a gate electrode structure on a semiconductor substrate, the gate electrode structure including a pad oxide film over the substrate, an HLD film over the pad oxide film, the pad oxide film and the HLD oxide film having an opening and nitride wall spacers over side walls of the HLD film within the opening, a gate oxide film being within the opening, the opening being filled with a gate electrode material;

etching the HLD film;

etching the pad oxide film formed at a lower portion of the HLD film to a predetermined thickness;

removing the nitride side wall spacer such that a thick pad oxide film is formed around the gate electrode and a thin pad oxide film is formed at a distance from the gate electrode;

forming a LDD region by implanting impurity ions into the semiconductor substrate at both sides of the gate electrode;

forming a side wall spacer at both sides of the gate electrode; and forming a source/drain by implanting impurity ions into the semiconductor substrate using the side wall spacer as a mask.

2. The method according to claim 1, wherein said method further comprises the step of forming a punch through stop layer in the semiconductor substrate within the opening by implanting impurity ions into the semiconductor substrate via the opening after the step of forming a nitride side wall spacer on the HLD side walls.

3. The method according to claim 2, wherein the impurity ions used during the step of forming the punch are p-type impurity ions.

4. The method according to claim 1, wherein said method further comprises the step of forming a threshold voltage control layer over an upper portion of the punch through stop layer in the semiconductor substrate in the opening.

5. The method according to claim 1, wherein said gate electrode is formed as a polysilicon, silicide, or polycide layer.

6. The method according to claim 1, wherein the step of etching the pad oxide film formed at a lower portion of the HLD film at a predetermined thickness is a step of etching the pad oxide film at about half the overall thickness thereof.

7. The method according to claim 1, wherein said method further comprises the step of forming a halo ion implantation layer so as to cover the LDD region after the step of forming the LDD region.

8. The method according to claim 1, wherein the step of forming the LDD region by implanting impurity ions is performed using n-type impurity ions at a dose of about 1 to $5\times10^{13}$ atoms/cm$^2$.

9. The method according to claim 1, wherein the step of forming the source/drain by implanting impurity ions into the semiconductor substrate is performed using n-type impurity ions at a dose of about 1 to $5\times10^{13}$ atoms/cm$^2$.

* * * * *